United States Patent
So et al.

(10) Patent No.: US 10,706,944 B2
(45) Date of Patent: Jul. 7, 2020

(54) MEMORY CONTROLLER FOR CONTROLLING MEMORY DEVICE BASED ON ERASE STATE INFORMATION AND METHOD OF OPERATING THE MEMORY CONTROLLER

(71) Applicant: SAMSUNG ELECTRONICS CO., LTD., Suwon-si, Gyeonggi-Do (KR)

(72) Inventors: Hye-Jeong So, Suwon-si (KR); Dong-Hwan Lee, Namyangju-si (KR); Seong-Hyeog Choi, Hwaseong-si (KR); Eun-Chu Oh, Hwaseong-si (KR); Jun-Jin Kong, Yongin-si (KR); Hong-Rak Son, Anyang-si (KR); Pil-Sang Yoon, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/747,790

(22) Filed: Jan. 21, 2020

(65) Prior Publication Data
US 2020/0160923 A1 May 21, 2020

Related U.S. Application Data

(63) Continuation of application No. 16/421,229, filed on May 23, 2019, now Pat. No. 10,566,066, which is a continuation-in-part of application No. 15/920,485, filed on Mar. 14, 2018, now Pat. No. 10,332,606.

(30) Foreign Application Priority Data

Jun. 8, 2017 (KR) .................. 10-2017-0071733

(51) Int. Cl.
*G11C 16/34* (2006.01)
*G06F 11/10* (2006.01)
(Continued)

(52) U.S. Cl.
CPC ...... *G11C 16/3427* (2013.01); *G06F 11/1008* (2013.01); *G06F 11/1012* (2013.01);
(Continued)

(58) Field of Classification Search
CPC ..... G11C 16/3427; G11C 16/10; G11C 16/26; G11C 16/14; G11C 16/0483; G11C 11/5635; G06F 11/1008
See application file for complete search history.

(56) References Cited

U.S. PATENT DOCUMENTS 8,670,285 B2    3/2014 Dong et al.
8,982,640 B2    3/2015 Hung et al.
(Continued)

FOREIGN PATENT DOCUMENTS

KR    10-2014-0020010    2/2014

OTHER PUBLICATIONS

E. Arikan, "Channel polarization: a method for constructing capacity-achieving codes for symmetric binary-input memoryless channels", IEEE Trans. Inf. Theory, vol. 55, No. 7, pp. 3051-3073, Jul. 2009.

*Primary Examiner* — Mohammed A Bashar
(74) *Attorney, Agent, or Firm* — Volentine, Whitt & Francos, PLLC

(57) ABSTRACT

A method of operating a memory controller includes classifying a plurality of memory cells in an erase state into a plurality of groups, based on erase state information about the plurality of memory cells in the erase state; setting at least one target program state for at least some memory cells from among memory cells included in at least one of the plurality of groups; and programming the at least some memory cells for which the at least one target program state has been set, to a program state other than the at least one target program state from among the plurality of program states.

19 Claims, 16 Drawing Sheets

(51) Int. Cl.
  *G11C 16/14* (2006.01)
  *G11C 16/10* (2006.01)
  *G11C 16/26* (2006.01)
  *G11C 11/56* (2006.01)
  *G11C 16/04* (2006.01)

(52) U.S. Cl.
  CPC .............. *G11C 16/10* (2013.01); *G11C 16/14* (2013.01); *G11C 16/26* (2013.01); *G11C 11/5628* (2013.01); *G11C 11/5635* (2013.01); *G11C 16/0483* (2013.01)

(56) References Cited

U.S. PATENT DOCUMENTS

| | | |
|---|---|---|
| 9,019,775 B2 | 4/2015 | Costa et al. |
| 9,047,974 B2 | 6/2015 | Huang et al. |
| 9,342,447 B2 | 5/2016 | Kim et al. |
| 10,332,606 B2 | 6/2019 | So et al. |
| 2012/0243330 A1* | 9/2012 | Yamano ................ G11C 16/14 365/185.22 |
| 2014/0047168 A1 | 2/2014 | Kim et al. |
| 2014/0247667 A1 | 9/2014 | Dutta et al. |
| 2015/0082121 A1 | 3/2015 | Wu et al. |
| 2015/0179271 A1 | 6/2015 | Nam et al. |
| 2015/0229337 A1 | 8/2015 | Alhussien et al. |
| 2015/0256196 A1 | 9/2015 | Alhussien et al. |
| 2015/0333775 A1 | 11/2015 | Korb et al. |
| 2016/0240256 A1 | 8/2016 | Lin et al. |
| 2018/0053543 A1* | 2/2018 | Lee ................... G11C 16/3459 |
| 2018/0122489 A1 | 5/2018 | Ray et al. |

\* cited by examiner

|  | E | P1 | P2 | P3 | P4 | P5 | P6 | P7 |
|---|---|---|---|---|---|---|---|---|
| 1st page | 1 | 0 | 0 | 0 | 0 | 1 | 1 | 1 |
| 2nd page | 1 | 1 | 1 | 0 | 0 | 0 | 0 | 1 |
| 3rd page | 1 | 1 | 0 | 0 | 1 | 1 | 0 | 0 |

| | E | P1 | P2 | P3 | P4 | P5 | P6 | P7 | P8 | P9 | P10 | P11 | P12 | P13 | P14 | P15 |
|---|---|---|---|---|---|---|---|---|---|---|---|---|---|---|---|---|
| 1st page | 1 | 0 | 0 | 0 | 1 | 1 | 0 | 0 | 0 | 0 | 0 | 1 | 1 | 1 | 1 | 1 |
| 2nd page | 1 | 1 | 1 | 0 | 0 | 0 | 0 | 1 | 1 | 0 | 0 | 0 | 0 | 1 | 1 | 1 |
| 3rd page | 1 | 1 | 1 | 1 | 1 | 0 | 0 | 0 | 0 | 0 | 1 | 1 | 0 | 0 | 0 | 1 |
| 4th page | 1 | 1 | 0 | 0 | 0 | 0 | 0 | 0 | 1 | 1 | 1 | 1 | 1 | 1 | 0 | 0 |

| Page | INDICATOR DATA | | | |
|---|---|---|---|---|
| | 0 | 1 | 2 | |
| 1st page | 0.0 | 2.0 | 4.0 | CHANGE BIT TO 0 |
| 2nd page | 0.0 | 2.0 | 4.0 | CHANGE BIT TO 0 |
| 3rd page | 0.0 | -2.0 | -4.0 | CHANGE BIT TO 1 |

MEMORY CONTROLLER FOR CONTROLLING MEMORY DEVICE BASED ON ERASE STATE INFORMATION AND METHOD OF OPERATING THE MEMORY CONTROLLER

CROSS-REFERENCE TO RELATED APPLICATION

This is a Continuation of U.S. application Ser. No. 16/421,229, filed May 23, 2019, which is a Continuation of U.S. application Ser. No. 15/920,485, filed Mar. 14, 2018, which issued as U.S. Pat. No. 10,332,606 on Jun. 25, 2019, and in which a claim of priority under 35 U.S.C. § 119 is made to Korean Patent Application No. 10-2017-0071733, filed on Jun. 8, 2017, in the Korean Intellectual Property Office, the entire contents of which are hereby incorporated by reference.

BACKGROUND

The present inventive concept herein relates to a memory controller and a method of operating the same, and more particularly, to a memory controller for controlling a memory device based on erase state information, and a method of operating the memory controller.

SUMMARY

A data storage device that can maintain stored data when turned off or powered down is referred to as non-volatile memory. Examples of non-volatile memory include read only memory (ROM), magnetic disks, optical discs, and flash memory. Flash memory is a type of non-volatile memory that stores data according to a change in a threshold voltage of a metal oxide semiconductor (MOS) transistor. Examples of flash memory include NAND flash and NOR flash. In flash memory, dispersion of a threshold voltage may vary according to a temperature or disturbances from nearby cells.

Embodiments of the inventive concept provide a memory controller for controlling an operation of a memory device by using erase state information, and a method of operating the memory controller.

Embodiments of the inventive concept provide a method of operating a memory controller, the method including classifying a plurality of memory cells in an erase state into a plurality of groups, based on erase state information about the plurality of memory cells in the erase state; setting at least one target program state for at least some memory cells from among memory cells included in at least one of the plurality of groups; and programming the at least some memory cells for which the at least one target program state has been set, to a program state other than the at least one target program state from among the plurality of program states.

Embodiments of the inventive concept further provide a memory controller for controlling a memory operation on a memory cell array including a plurality of memory cells, the memory controller including an erase information collector configured to receive erase state information about the plurality of memory cells from the memory cell array, classify the plurality of memory cells into a first group and a second group based on the erase state information, and output first information about the first group and second information about the second group; and an erase state control encoder configured to receive the first information and the second information from the erase information collector, set at least one target program state from among a plurality of program states, encoding data to be programmed to memory cells included in the first group based on the first information and the at least one target program state, and encode data to be programmed to memory cells included in the second group based on the second information.

Embodiments of the inventive concept still further provide a memory system including a memory device having a memory cell array; a memory controller configured to control a memory operation on the memory cell array; and a target program state controller configured to classify a plurality of memory cells of the memory cell array that are in an erase state into a plurality of groups based on erase state information about the plurality of memory cells in the erase state, set at least one target program state for at least some memory cells from among memory cells classified in at least one of the plurality of groups, and program the at least some memory cells for which the at least one target program state has been set to a program state other than the target program state.

BRIEF DESCRIPTION OF THE DRAWINGS

Embodiments of the inventive concept will be more clearly understood from the following detailed description taken in conjunction with the accompanying drawings in which:

FIG. 8A illustrates a table for explaining bit mapping for programming memory cells, according to an embodiment of the inventive concept;

FIG. 8B illustrates another table for explaining bit mapping for programming memory cells, according to an embodiment of the inventive concept;

FIG. 9 illustrates a table for explaining log likelihood ratio (LLR) mapping according to an embodiment of the inventive concept;

DETAILED DESCRIPTION OF THE EMBODIMENTS

As is traditional in the field of the inventive concept, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concept. Likewise, the blocks of the embodiments may be physically combined into more complex blocks without departing from the scope of the inventive concepts.

Figure 1:
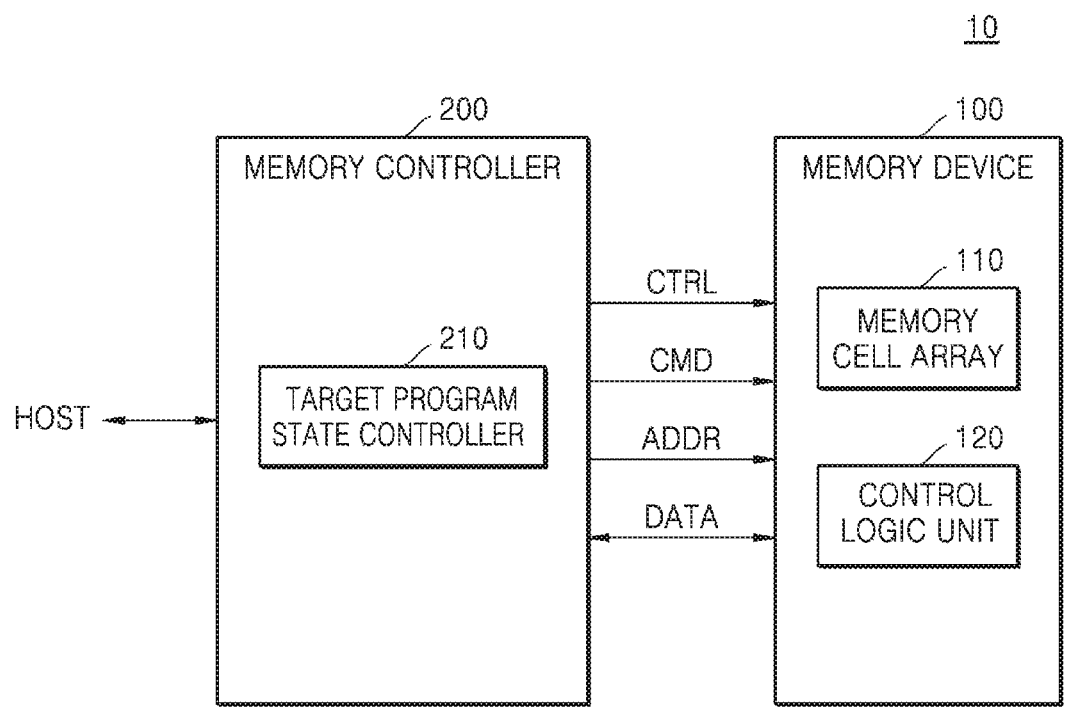
FIG. 1 illustrates a schematic block diagram of a memory system according to an embodiment of the inventive concept.

FIG. 1 illustrates a block diagram of a memory system 10 according to an embodiment of the inventive concept. Referring to FIG. 1, the memory system 10 includes a memory device 100 and a memory controller 200. The memory device 100 includes a memory cell array 110 and a control logic unit 120. The memory device 100 may be, for example, a nonvolatile memory. According to some embodiments, the memory system 10 may be implemented using an internal memory embedded in an electronic device. For example, the memory system 10 may be an embedded Universal Flash Storage (UFS), an embedded Multi-Media Card (eMMC), or a solid state drive (SSD), or the like. According to some embodiments, the memory system 10 may be implemented using an external memory detachable from an electronic device. For example, the memory system 10 may be a Universal Flash Storage (UFS) memory card, a CompactFlash (CF) card, a Secure Digital (SD) card, a micro-SD card, a mini-SD card, an extreme Digital (xD) card, or a Memory Stick (MS), or the like.

The memory controller 200 may control a memory operation with respect to the memory device 100 in response to a read/write request from a host HOST (not shown in FIG. 1). The memory operation may include, for example, an operation of reading data from the memory device 100 or programming data to the memory device 100. In other words, the memory controller 200 may control the memory device 100 such that data stored in the memory device 100 is read out or data is programmed to the memory device 100.

In detail, the memory controller 200 may provide the memory device 100 with an address ADDR, a command CMD, and a control signal CTRL to control a program operation, a read operation, and an erase operation on the memory device 100. Data DATA for programming the memory device 100 may be transmitted from the memory controller 200 to the memory device 100, and data DATA read out from the memory device 100 may be transmitted to the memory controller 200.

The memory controller 200 may include a target program state controller 210. According to an embodiment, the target program state controller 210 may set at least one target program state for at least some of the memory cells included in the memory cell array 110, based on erase state information about the memory cells included in the memory cell array 110. The target program state controller 210 may output various types of signals to the memory device 100 to program the at least some memory cells for which the target program state has been set to one of program states except for (i.e., other than) the target-program state from among a plurality of program states for the memory cells included in the memory cell array 110.

According to an embodiment of the inventive concept, the target program state controller 210 may include an erase state as one of the target program states. The target program state controller 210 may include an uppermost program state as one of the target program states. The target program state controller 210 may select bit-mapping corresponding to the plurality of program states for the memory cells included in the memory cell array 110, based on the target program states.

The memory cell array 110 may include a plurality of memory cells. The plurality of memory cells may be, for example, flash memory cells. Embodiments of the inventive concept will now be described in detail by illustrating a case where the plurality of memory cells are NAND flash memory cells. However, the plurality of memory cells are not limited thereto. According to some embodiments, the plurality of memory cells may be for example resistive memory cells, such as resistive random access memories (ReRAMs), phase change RAMs (PRAMs), or magnetic RAMs (MRAMs), or the like.

The memory cell array 110 may include a plurality of NAND strings that are respectively connected to intersections of a plurality of string select lines and a plurality of bit lines. Each NAND string may include a plurality of memory cells. The plurality of string select lines may share a word line that is on the same level as the string select lines.

Figure 2:
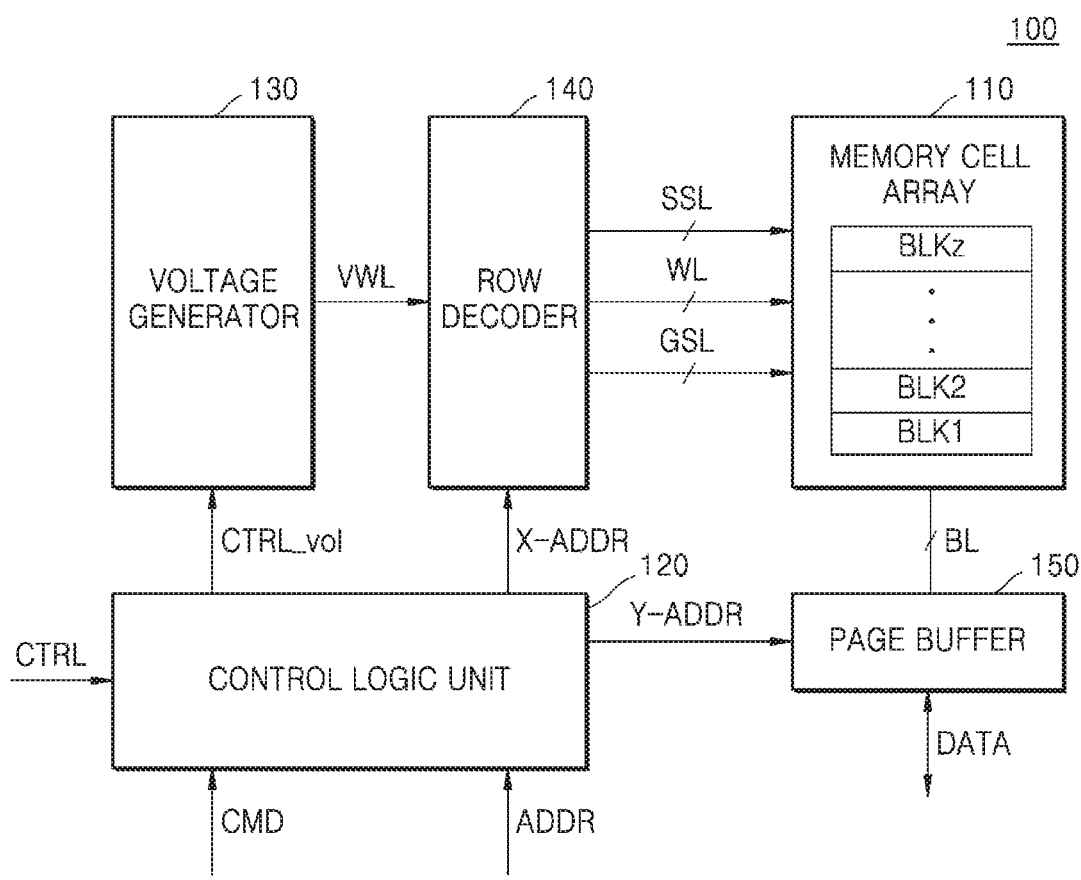
FIG. 2 illustrates a block diagram of the memory device of FIG. 1, according to an embodiment of the inventive concept.

FIG. 2 illustrates a block diagram of the memory device 100 of FIG. 1, according to an embodiment of the inventive concept. Referring to FIG. 2, the memory device 100 includes the memory cell array 110, the control logic unit 120, a voltage generator 130, a row decoder 140, and a page buffer 150. Although not shown in FIG. 2, the memory device 100 may further include a data input/output (I/O) circuit or an I/O interface.

The memory cell array 110 may include a plurality of memory cell blocks BLK1 to BLKz (z is an integer larger than 1) and each of the memory cell blocks includes a plurality of memory cells, and may be connected to word lines WL, string select lines SSL, ground select lines GSL, and bit lines BL. The memory cell array 110 may be connected to the row decoder 140 via the word lines WL, the string select lines SSL, and the ground select lines GSL, and may be connected to the page buffer 150 via the bit lines BL.

Each memory cell may store one or more bits. In detail, each memory cell may be implemented using for example a single level cell (SLC), a multi level cell (MLC), a triple level cell (TLC), or a quad level cell (QLC). For example, some of the memory cells included in the memory cell array 110 may be implemented using SLCs, while other memory cells included in the memory cell array 110 may be implemented using MLCs, TLCs, or quad level cells.

Figure 4:
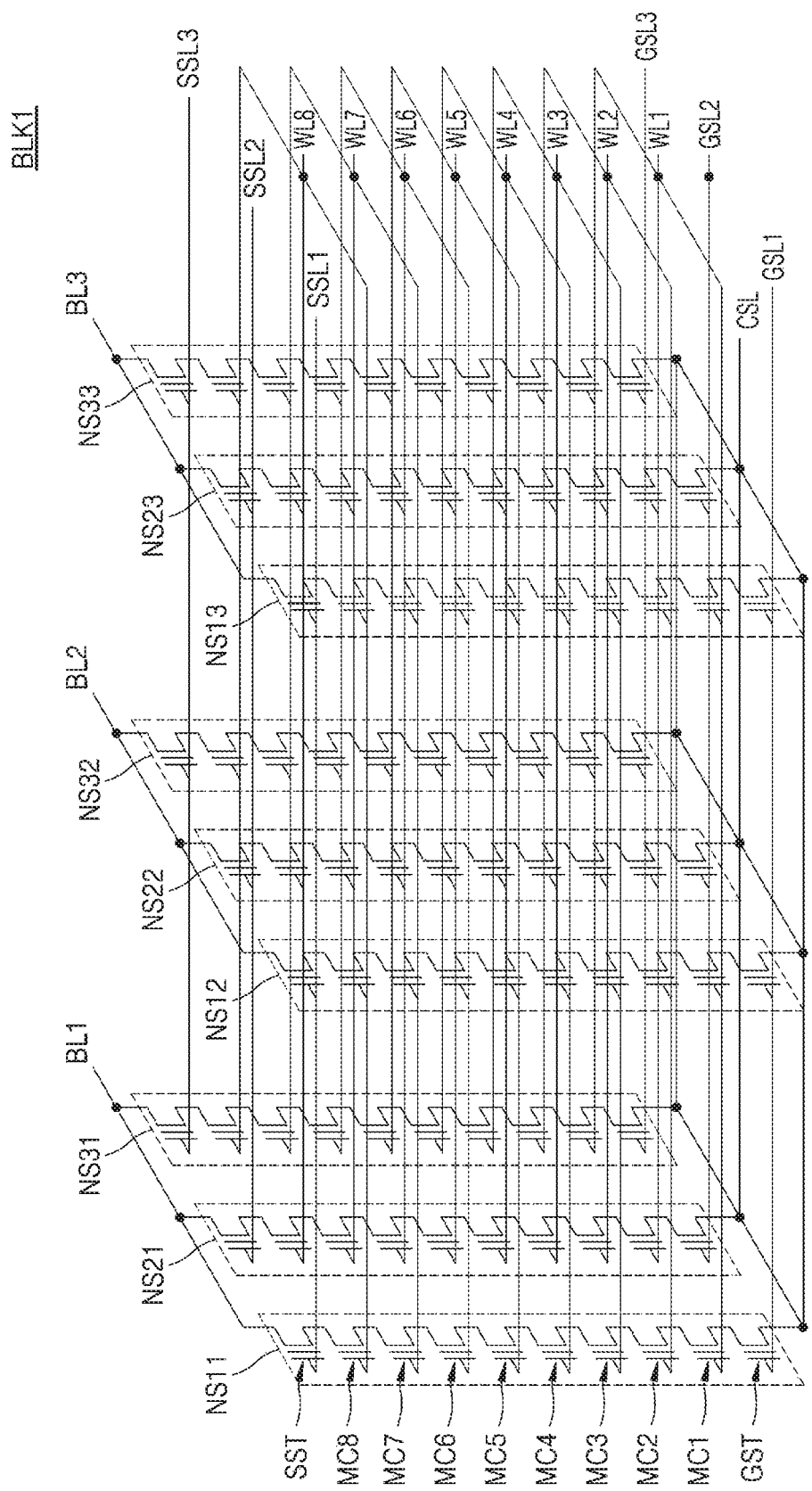
FIG. 4 illustrates a circuit diagram of an equivalent circuit of a memory block of FIG. 2, according to an embodiment of the inventive concept.

According to an embodiment of the inventive concept, the memory cell array 110 may include a two-dimensional (2D) memory cell array that may include a plurality of NAND strings arranged in column and row directions. According to another embodiment, the memory cell array 110 may include a three-dimensional (3D) memory cell array that may include a plurality of NAND strings. Each NAND string may include memory cells respectively connected to word lines vertically stacked on a substrate. FIG. 2 will be hereinafter described assuming that memory cell array 110 includes a three-dimensional (3D) memory cell array such as shown in FIG. 4. The 3D memory cell array is formed monolithically on a physical level having a circuit formed on or in a silicon substrate as a circuit related with an operation of memory cells, with an active region arranged on the silicon substrate. The term "monolithic" means that layers of each level that constitute the array are stacked directly on layers of each lower level included in the array.

The control logic unit 120 may output various control signals for writing data to the memory cell array 110 or for reading data from the memory cell array 110, based on the command CMD, the address ADDR, and the control signal CTRL received from the memory controller 200 shown in FIG. 1. In this way, the control logic unit 120 may generally control various operations performed in the memory device 100.

The various control signals output by the control logic unit 120 may be provided to the voltage generator 130, the row decoder 140, and the page buffer 150. In detail, the control logic unit 120 may provide a voltage control signal CTRL_vol to the voltage generator 130, may provide a row address X_ADDR to the row decoder 140, and may provide a column address Y_ADDR to the page buffer 150. However, the control logic unit 120 is not limited to providing the above noted control signals, and may further provide other various control signals to the voltage generator 130, the row decoder 140, the page buffer 150 and various other elements and/or circuits of the memory device 100.

The voltage generator 130 may generate various types of voltages for executing a program (or write) operation, a read operation, and an erase operation with respect to the memory cell array 110, among other various types of voltages, based on the received voltage control signal CTRL_vol. In detail, the voltage generator 130 may for example generate a program voltage, a read voltage, a program inhibit voltage, a read inhibit voltage, an erase verify voltage, or a program verify voltage as a word line voltage VWL. The voltage generator 130 may further generate a string select line voltage and a ground select line voltage, based on the voltage control signal CTRL_vol. The voltage generator 130 may further generate an erase voltage that is to be provided to the memory cell array 110.

The row decoder 140 may select some of the word lines WL in response to the row address X-ADDR received from the control logic unit 120. In detail, during a read operation, the row decoder 140 may for example apply the read voltage to a selected word line and apply the read inhibit voltage to unselected word lines. During a program operation, the row decoder 140 may for example apply the program voltage to a selected word line and apply the program inhibit voltage to unselected word lines. The row decoder 140 may also select some of the string select lines SSL in response to the row address X-ADDR received from the control logic unit 120.

The page buffer 150 may be connected to the memory cell array 110 through the bit lines BL and may select some of the bit lines BL in response to the column address Y-ADDR received from the control logic unit 120. In detail, during a read operation, the page buffer 150 may operate as a sense amplifier to sense the data DATA stored in the memory cell array 110, and may provide the sensed data DATA to the memory controller 200 shown in FIG. 1. During a program operation, the page buffer 150 may operate as a write driver to apply voltages to the bit lines BL according to the data DATA received from the memory controller 200 shown in FIG. 1 to be stored in the memory cell array 110.

The page buffer 150 may selectively pre-charge the bit lines BL. The page buffer 150 may apply pre-charge voltages to the selected bit lines BL in a pre-charge period, and then may float the bit lines BL so that the bit lines are not electrically connected to another non-floating conductor, a potential, or ground.

Figure 3:
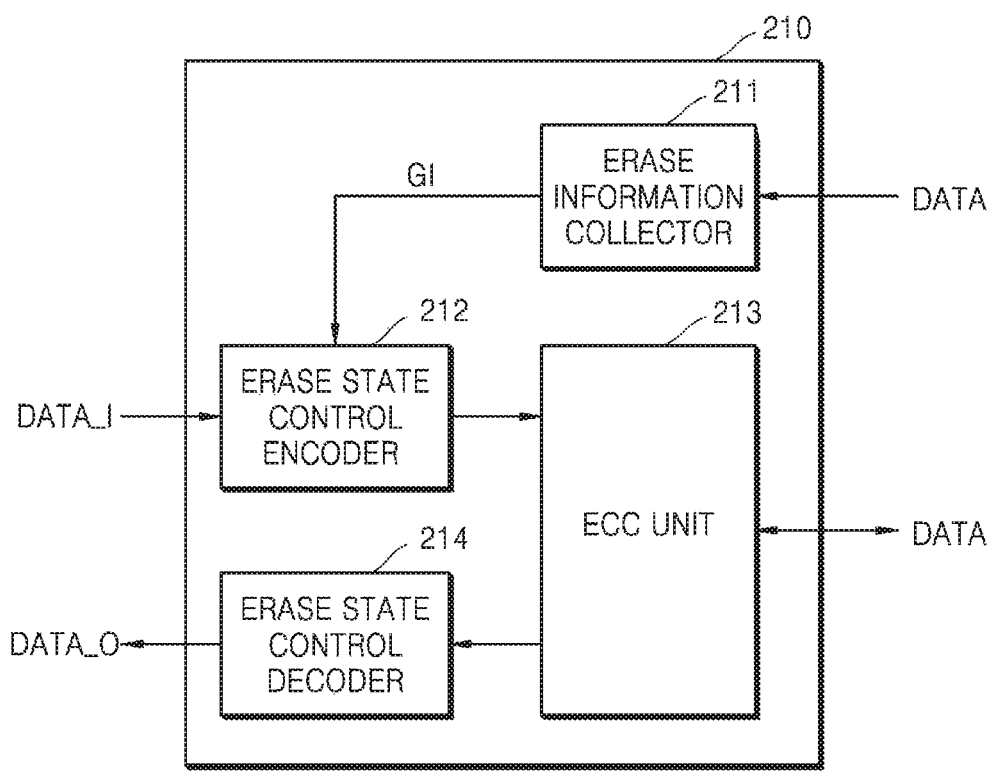
FIG. 3 illustrates a block diagram of a target program state controller included in the memory device of FIG. 1, according to an embodiment of the inventive concept.

FIG. 3 illustrates a block diagram of the target program state controller 210 of FIG. 1, according to an embodiment of the inventive concept. Referring to FIG. 3, the target program state controller 210 includes an erase information collector 211, an erase state control encoder 212, an error correction code (ECC) unit 213, and an erase state control decoder 214.

The erase information collector 211 may receive the data DATA from the memory device 100, and may classify the memory cells included in the memory device 100 into a plurality of groups, based on the data DATA. The data DATA may be, for example, information sensed by the page buffer 150 (shown in FIG. 2) based on a first critical voltage, wherein the information is sensed from memory cells of a memory cell block in an erase state. The erase information collector 211 may classify memory cells in the erase state into the plurality of groups, based on the information sensed based on the first critical voltage, and may output information about this grouping as group information GI. According to an embodiment, the erase information collector 211 may classify memory cells, from among the memory cells in the erase state, having a threshold voltage greater than the first critical voltage into a first group. According to an another embodiment, the erase information collector 211 may classify a predetermined number of memory cells, from among the memory cells in the erase state, into the first group.

The erase state control encoder 212 may receive input data DATA_I from the host HOST and receive the group information GI from the erase information collector 211. According to an embodiment, the erase state control encoder 212 may set a target program state for each memory cell during a program operation on a memory cell block in the erase state, based on the input data DATA_I and the group information GI. The data DATA_I may correspond to user data as subsequently described with respect to FIGS. 10 and 11.

The erase state control encoder 212 may encode data that is to be programmed to some of the memory cells included in the memory cell block in the erase state, based on the group information GI and the set target program states. In detail, when the erase state control encoder 212 controls a program operation on some of the memory cells included in the memory cell block in the erase state, the erase state control encoder 212 may encode data that is to be programmed to the some memory cells such that a program operation is performed to one of program states other than the set target program states. The erase state control encoder 212 may output encoded data to the ECC unit 213.

According to an embodiment, the erase state control encoder 212 may encode the data that is to be programmed to the some of the memory cells included in the memory cell block in the erase state, based on at least one of various codes (for example, a convolutional code and a polar code) based on coset coding. For example, when the erase state control encoder 212 performs encoding based on a polar code, the erase state control encoder 212 may determine parity bits for programming memory cells, via a successive cancellation or list successive cancellation algorithm. The parity bits may be, for example, extra bits added for encoding in addition to message bits. The message bits may include, for example, data information input from the host HOST of FIG. 1.

According to an embodiment, after determining the parity bits, the erase state control encoder 212 may multiply page data including the parity bits and the message bits by a deflection matrix to encode the data that is to be programmed. The deflection matrix may be provided as follows:

$$G_n = \begin{bmatrix} 1 & 0 \\ 1 & 1 \end{bmatrix}^{\otimes m} \qquad \text{[Equation 1]}$$

The a symbol $\otimes$ may mean a Kronecker product operation.

The ECC unit 213 may receive the encoded data from the erase state control encoder 212 and may output data DATA obtained by ECC-encoding the received encoded data to the memory device 100 of FIG. 1. The ECC unit 213 may also receive the read-out data DATA from the memory device 100 of FIG. 1, perform ECC decoding on the read-out data DATA, and output a result of the ECC decoding to the erase state control decoder 214.

For example, the ECC unit 213 may perform error correction by using an iterative code, such as a low density parity check (LDPC) code or a turbo code. By using the iterative code, the ECC unit 213 may perform an iterative operation of iterating ECC decoding during error bit correction. The ECC unit 213 may include all of a circuit, a system, or a device for ECC encoding and ECC decoding.

The erase state control decoder 214 may receive the data obtained by the ECC decoding from the ECC unit 213 and perform decoding based on the encoding performed by the erase state control encoder 212. According to an embodiment, when the erase state control encoder 212 performs encoding based on a polar code, the erase state control decoder 214 may multiply the received data by a deflection matrix and may select message bits to thereby restore output data DATA_O.

FIG. 4 illustrates a circuit diagram of an equivalent circuit of a first memory block BLK1 of FIG. 2, according to an embodiment of the inventive concept.

Referring to FIG. 4, the first memory block BLK1 may be a NAND flash memory of a vertical structure. Each of a plurality of memory blocks BLK1 through BLKz shown in FIG. 2 may be implemented as shown in FIG. 4. The first memory block BLK1 may include a plurality of NAND strings NS11 through NS33 (that is, NAND strings NS11, NS12, NS13, NS21, NS22, NS23, NS31, NS32 and NS33), a plurality of word lines WL1 through WL8 (that is, word lines WL1, WL2, WL3, WL4, WL5, WL6, WL7 and WL8), a plurality of bit lines BL1, BL2 and BL3, a plurality of ground select lines GSL1, GSL2 and GSL3, a plurality of string select lines SSL1, SSL2 and SSL3, and a common source line CSL. The number of NAND strings, the number of word lines, the number of bit lines, the number of ground select lines, and the number of string select lines may vary according to embodiments.

The NAND strings NS11, NS21, and NS31 are provided between the first bit line BL1 and the common source line CSL. The NAND strings NS12, NS22, and NS32 are provided between the second bit line BL2 and the common source line CSL. The NAND strings NS13, NS23, and NS33 are provided between the third bit line BL3 and the common source line CSL. Each of the NAND strings NS11, NS21, NS31, NS12, NS22, NS32, NS13, NS23, NS33 may include a string select transistor SST, a plurality of memory cells MC1 through MC8 (that is, memory cells MC1, MC2, MC3, MC4, MC5, MC6, MC7 and MC8), and a ground select transistor GST that are serially connected to each other.

NAND strings commonly connected to one bit line may configure one column.

For example, the NAND strings NS11, NS21, and NS31 commonly connected to the first bit line BL1 may correspond to a first column, the NAND strings NS12, NS22, and NS32 commonly connected to the second bit line BL2 may correspond to a second column, and the NAND strings NS13, NS23, and NS33 commonly connected to the third bit line BL3 may correspond to a third column.

NAND strings commonly connected to one string select line may configure one row. For example, the NAND strings NS11, NS12, and NS13 commonly connected to the first string select line SSL1 may correspond to a first row. The NAND strings NS21, NS22, and NS23 commonly connected to the second string select line SSL2 may correspond to a second row. The NAND strings NS31, NS32, and NS33 commonly connected to the third string select line SSL3 may correspond to a third row.

The string select transistors SST may be connected to the corresponding string select lines SSL1 through SSL3. The memory cells MC1 through MC8 may be connected to the word lines WL1 through WL8, respectively. The ground select transistors GST may be connected to the corresponding ground select lines GSL1 through GSL3, and the string select transistors SST may be connected to the corresponding bit lines BL1 through BL3. The ground select transistors GST may also be commonly connected to the common source line CSL.

According to the present embodiment, word lines (for example, WL1) of the same height are commonly connected to each other, the string select lines SSL1 through SSL3 are electrically separated from each other, and the ground select lines GSL1 through GSL3 are electrically separated from each other. For example, when memory cells connected to the first word line WL1 and included in the NAND strings NS11, NS12, and NS13 corresponding to the first row are programmed, the first word line WL1 and the first string select line SSL1 are selected. However, the word lines, string select lines and ground select lines are not limited thereto. According to another embodiment, the ground select lines GSL1 through GSL3 may be commonly connected to each other.

Figure 5:
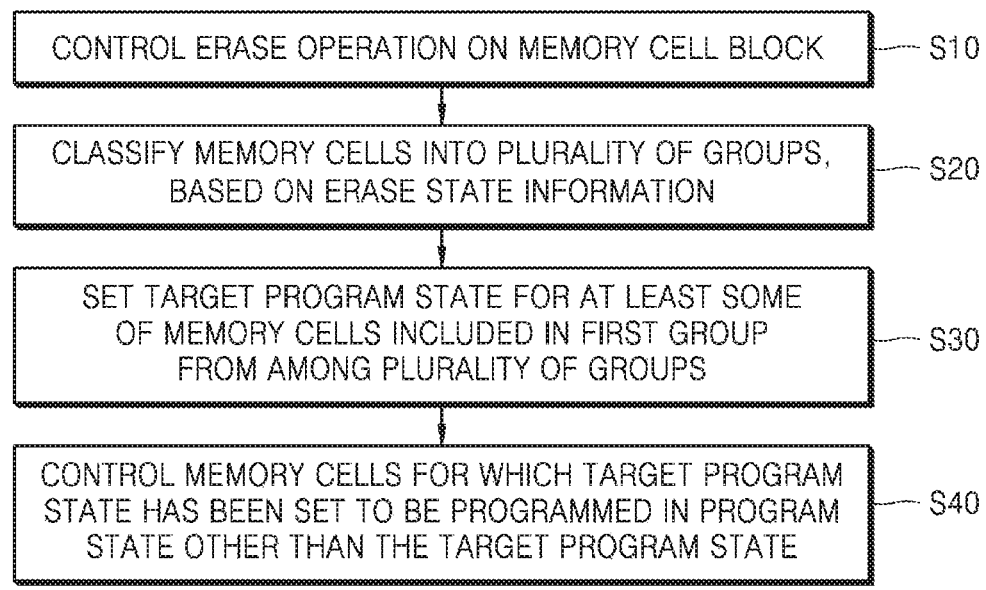
FIG. 5 illustrates a flowchart of a method of operating a memory controller, according to an embodiment of the inventive concept.

FIG. 5 illustrates a flowchart of a method of operating a memory controller, according to an embodiment of the inventive concept. For example, the method of operating a memory controller according to the present embodiment may be performed in a time sequential manner in the memory controller 200 of FIG. 1.

Referring to FIG. 5, in operation S10, the memory controller 200 controls an erase operation on a memory cell block included in the memory device 100. For example, when the memory device 100 is a flash memory device, overwriting may not be freely performed on memory cells. To overwrite data to flash memory, an erase operation may need to be performed before writing the data. This erase operation is referred to as an erase-before-write operation. For example, when a read/write operation on the memory device 100 is performed in units of pages, an erase operation may be performed in units of blocks, wherein a block is larger than a page.

In operation S20, after controlling the erase operation, the memory controller 200 classifies the memory cells of the erased memory cell block into a plurality of groups, based on erase state. According to an embodiment, in operation S20, the memory controller 200 may classify memory cells having a threshold voltage greater than a first critical voltage from among memory cells in an erase state into a first group. In detail, after the memory controller 200 performs at least one read operation on the memory cells, based on the first critical voltage, the memory controller 200 may perform an operation of marking some memory cells, based on a result of the read operation. The result of the read operation may include, for example, information about the memory cells having a threshold voltage greater than the first critical voltage. According to an another embodiment, in operation S20, the memory controller 200 may classify a predetermined number of memory cells, from among the memory cells in the erase state, into the first group. In detail, the memory controller 200 may perform an operation of marking the predetermined number of memory cells.

According to an embodiment, in operation S20, the memory controller 200 may classify the memory cells having a threshold voltage greater than the first critical voltage from among the memory cells in the erase state into the first group, and classify memory cells having a threshold voltage between the first critical voltage and a second critical voltage lower than the first critical voltage into a second group. In detail, after performing at least one read operation on the memory cells, based on the first and second critical voltages, the memory controller 200 may perform an operation of marking (i.e., designating) some memory cells, based on a result of the read operation. According to an embodiment, all of the memory cells included in the first group may be marked with a value, and the memory cells included in the second group may be marked with a value different than the value used to mark (i.e., designate) the memory cells included in the first group. All of the remaining memory cells that are not in either the first group or the second group may be marked with "0". In this example, the values used to mark the memory cells of the first and second groups are greater than zero. For example, the marking of a memory cell may be an indicator that indicates that the memory cell is to be prevented from being programmed to a target program state during subsequent encoding. Accordingly, when the marked value is equal to or greater than "1", programming to a target-program state is prevented.

According to an embodiment, the operation S20 may further include setting indicator data by using marking data corresponding to each of a plurality of groups for the memory cells in the erase state. The indicator data may serve as a basis for setting at least one target program state.

In operation S30, after classifying the memory cells into the plurality of groups, the memory controller 200 sets a target program state for at least some of the memory cells included in the first group from among the plurality of groups. According to an embodiment, the operation S30 may further include mapping a log likelihood ratio (LLR) for the memory cells, based on the indicator data set based on the marking data in the operation S20. The LLR may be a value obtained by taking a log of a ratio of likelihood that data stored in each memory cell is to correspond to '1' or '0'.

The LLR may be, for example, a basis for determining parity bits for memory cells. According to an embodiment, the operation S30 may further include determining parity bits for the memory cells based on the LLR and encoding program data corresponding to each memory cell based on the parity bits. The encoding may be performed based on, for example, a polar code.

According to an embodiment, the target program state may include an erase state. According to an embodiment, the target program state may include an uppermost program state. In detail, encoding may be performed such that some of the memory cells to be programmed in the erase state are programmed in program states other than the erase state and the uppermost program state. In addition, encoding may be performed such that some of the memory cells to be programmed in the uppermost program state are programmed in program states other than the erase state and the uppermost program state.

In operation S40, after setting the target program state, the memory controller 200 controls the memory cells for which the target program state has been set to be programmed to a program state other than the target program state. To control the programming in the program state, the memory controller 200 may provide the address ADDR, the command CMD, and the control signal CTRL to the memory device 100. The memory controller 200 may also provide the data DATA for programming to the memory device 100, based on the encoding performed by the target program state controller 210.

Figure 6:
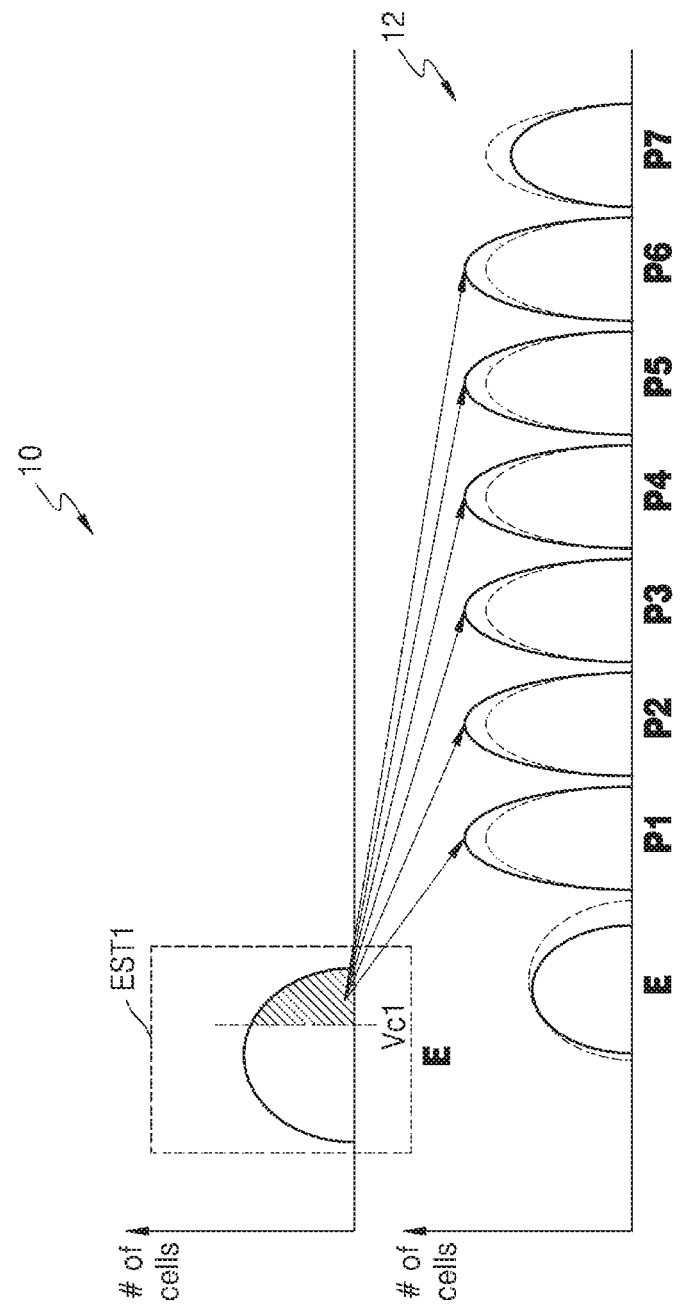
FIG. 6 illustrates a graph for explaining a program operation according to an embodiment of the inventive concept.

FIG. 6 illustrates a graph for explaining a program operation according to an embodiment of the inventive concept. In detail, a first dispersion 10 may represent a threshold voltage dispersion of memory cells included in memory blocks in an erase state before a program operation, and a second dispersion 12 may represent a threshold voltage dispersion of memory cells included in memory blocks after a program operation. For convenience of explanation, the present embodiment assumes a case where a memory cell is a TLC. However, in other embodiments the memory cell may be a different type other than a TLC.

Referring to FIG. 6, memory cells included in a memory block before a program operation is performed may be in an erase state. In a dispersion for the memory cells in the erase state, memory cells having a threshold voltage equal to or greater than a first critical voltage $Vc\_1$ may be classified into a first group $GRP\_1$.

According to an embodiment of the inventive concept, the memory cells included in the first group $GRP\_1$ may be programmed in one of first through sixth program states P1 through P6 corresponding to program states other than an erase state E and an uppermost program state P7. In detail, memory cells to be programmed in the erase state E from among the memory cells included in the first group $GRP\_1$ may be programmed in one of the first through sixth program states P1 through P6 via encoding performed in the erase state control encoder 212 of FIG. 3. Memory cells to be programmed in the uppermost program state P7 from among the memory cells included in the first group GRP_1 may be programmed in one of the first through sixth program states P1 through P6 via encoding performed in the erase state control encoder 212 of FIG. 3.

In the second dispersion 12, a solid line distribution represents a case where erase state control encoding according to an embodiment of the inventive concept has been performed, and a dotted line distribution represents a case where the erase state control encoding has not been performed. Referring to the second dispersion 12, because the memory cells to be programmed in the erase state from among the memory cells included in the first group GRP_1 are programmed in the first through sixth program states P1 through P6 other than the erase state, the threshold voltage dispersion of the erase state after the program operation may have a relatively small width when the erase state control encoding has been performed, compared with when the erase state control encoding has not been performed.

Referring to the second dispersion 12, because the memory cells to be programmed in the uppermost program state from among the memory cells included in the first group GRP_1 are programmed in the first through sixth program states P1 through P6 other than the uppermost program state, a threshold voltage dispersion of the uppermost program state after the program operation may have a relatively low height when the erase state control encoding has been performed, compared with when the erase state control encoding has not been performed. Accordingly, heights of the threshold voltage dispersions of the first through sixth program states after the program operation may be relatively greater when the erase state control encoding has been performed, than when the erase state control encoding has not been performed.

The threshold voltage dispersion of the erase state E after a program operation may have a large dispersion width and may be greatly affected by disturbance, compared with those of the other program states. The threshold voltage dispersion of the erase state E may become wider as it is affected by more disturbances, and thus an overlap with the threshold voltage dispersion of the first program state P1 may increase. In particular, when the first group GRP_1, namely, memory cells near a right end of the threshold voltage dispersion of the erase state E after an erase operation, is in the erase state E after a program operation, the memory cells may affect whether an overlap between the threshold voltage dispersion of the erase state E and the threshold voltage dispersion of the first program state P1 increases.

The memory cells of the uppermost program state P7 may become a main cause of a disturbance in the memory cells in the erase state E. For example, the memory cells in the uppermost program state P7 may cause a disturbance in the memory cells in the erase state E around them, thereby increasing the width of the threshold voltage dispersion of the erase state E or moving the dispersion rightwards.

In a memory controller and a method of operating the same, according to the inventive concept, memory cells vulnerable to disturbances from among memory cells in an erase state before programming are classified, and at least one target program state is set for the memory cells, leading to reduction in overlap between dispersions due to disturbances. Therefore, an error rate of data may be addressed (i e, minimized), and thus the reliability of a memory system may improve.

Accordingly, in embodiments of the inventive concept, the memory cells to be the erase state from among the memory cells included in the first group GRP_1 are programmed in program states other than the erase state and the uppermost program state, thus reducing threshold voltage dispersion of the erase and uppermost program states, so that functionality of the memory controller may be improved and error rate of data may be reduced, resulting in improved memory reliability.

Figure 7A:
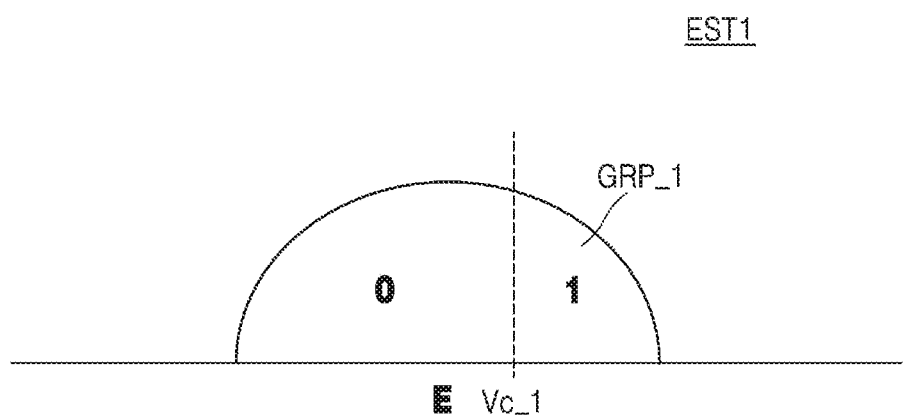
FIG. 7A illustrates a diagram for explaining setting of indicator data for memory cells in an erase state that are classified into a plurality of groups, according to an embodiment of the inventive concept.
Figure 7B:
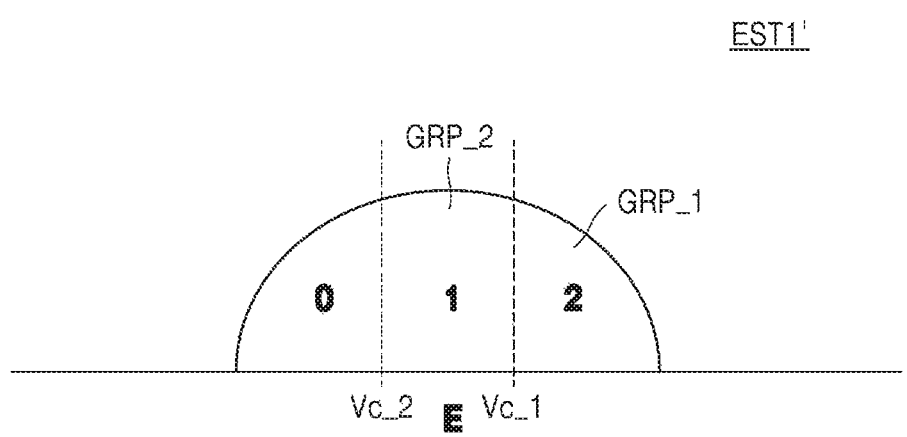
FIG. 7B illustrates another diagram for explaining setting of indicator data for memory cells in an erase state that are classified into a plurality of groups, according to an embodiment of the inventive concept.

FIGS. 7A and 7B illustrate diagrams for explaining setting of indicator data for memory cells in an erase state that are classified into a plurality of groups, according to an embodiment of the inventive concept. FIGS. 7A and 7B may be embodiments of the erase state dispersion illustrated in the first dispersion 10 of FIG. 6. In detail, FIG. 7A may be a case where the first group GRP_1 is classified from among the memory cells in the erase state, and FIG. 7B may be a case where the first and second groups GRP_1 and GRP_2 are classified from among the memory cells in the erase state.

Referring to FIG. 7A, memory cells having a threshold voltage greater than the first critical voltage Vc_1 from among the memory cells in the erase state may be classified into the first group GRP_1. However, the present embodiment is not limited thereto. In another embodiment, the first group GRP_1 may be classified as a predetermined number of memory cells among the memory cells in the erase state.

Respective indicator data may be set for the memory cells included in the first group GRP_1 and the memory cells not included in the first group GRP_1. The indicator data may be set by the erase information collector 211 of FIG. 3, based on marking of the memory cells, and may be included in the group information GI of FIG. 3 and provided to the erase state control encoder 212 of FIG. 3. According to an embodiment, the indicator data may be updated during each encoding operation on page data. The indicator data may be stored in, for example, a special storage space within the memory device 100 or the memory cells included in the memory cell array 110.

In detail, the indicator data for the memory cells included in the first group GRP_1 may be set to be '1'. The indicator data for the memory cells not included in the first group GRP_1 may be set to be '0'. Each indicator data may be a basis for, for example, LLR mapping with respect to each memory cell.

Referring to FIG. 7B, memory cells having a threshold voltage greater than the first critical voltage Vc_1 from among the memory cells in the erase state may be classified into the first group GRP_1, and memory cells having a threshold voltage smaller than the first critical voltage Vc_1 and greater than a second critical voltage Vc_2 from among the memory cells in the erase state may be classified into the second group GRP_2. However, the present embodiment is not limited thereto. In another embodiment, the first group GRP_1 may be classified as a first predetermined number of memory cells among the memory cells in the erase state. The second group GRP_2 may be classified as a second predetermined number of memory cells among the memory cells in the erase state excluding the memory cells classified as the first group GRP_1.

Respective indicator data may be set for the first group GRP_1 and may be characterized as first information, respective indicator data may be set for the second group GRP_2 and may be characterized as second information, and respective indicator data may be set for memory cells not included in any other groups and may be characterized as third information. The indicator data characterized as the first, second and third information may be included in the group information GI of FIG. 3 and provided to erase state control encoder 212 of FIG. 3.

In detail, indicator data of '2' may be set for the memory cells included in the first group GRP_1. Indicator data of '1' may be set for the memory cells included in the second group GRP_2. Indicator data of '0' may be set for the memory cells included in none of the first and second groups GRP_1 and GRP_2.

FIG. 8A illustrates a table for explaining bit mapping for programming memory cells, according to an embodiment of the inventive concept. For example, the bit mapping may be used in operation S40 of FIG. 5 to program memory cells for which the target program state has been set to a program state other than the target program state. For convenience of explanation, the present embodiment assumes a case where a memory cell is a TLC. However, in other embodiments the memory cell may be a different type other than a TLC.

Referring to FIG. 8A, when memory cells are TLCs, each of the memory cells may store a least significant bit (LSB), a central significant bit (CSB), and a most significant bit (MSB). Further referring to FIG. 4, LSBs stored in memory cells in a first row from among the memory cells connected to the word line WL1 may form a first page, CSBs stored therein may form a second page, and MSBs stored therein may form a third page.

The memory controller 200 of FIG. 1 may map data that is to be programmed with the memory cells, based on a first table TB1. During data mapping, the memory controller 200 of FIG. 1 may change bit mapping to increase a mapping effect such that data is not mapped with the set target program states. According to the proposed bit mapping, target program states share more bit mapping as bits within a word line form a lower page. According to an embodiment, in the first table TB1, a first page and a second page of the erase state E may have the same bit mapping as those of the uppermost program state P7. For example, when the target program states are the erase state E and the uppermost program state P7, bit mapping in which the first page and the second page of the erase state E have the same bit mapping as the first page and the second page of the uppermost program state P7 and in which only the third page of the erase state E has different bit mapping from the third page of the uppermost program state P7 may be used in the memory controller 200 of FIG. 1. That is, in embodiments of the inventive concept in which a plurality of target program states are set, bit mapping is performed such that at least the first page of the bit mapping of the plurality of target program states is shared between the plurality of target program states. Thus, when the erase state E and the uppermost program state P7 are simultaneously set as target program states for some memory cells in the erase state before a program operation, the memory controller 200 of FIG. 1 may perform encoding with increased data mapping effect.

FIG. 8B illustrates a table for explaining bit mapping for programming memory cells, according to another embodiment of the inventive concept. For convenience of explanation, the present embodiment assumes a case where a memory cell is a QLC. However, in other embodiments the memory cell may be a different type other than a QLC.

Referring to FIG. 8B, when memory cells are QLCs, each of the memory cells may store an LSB, an ESB, an upper significant bit (USB), and an MSB. Further referring to FIG. 4, LSBs stored in memory cells in a first row from among the memory cells connected to the word line WL1 may form a first page, and MSBs stored therein may form a fourth page. USBs stored in the memory cells in the first row from among the memory cells connected to the word line WL1 may form a third page, and ESB stored therein may form a second page.

The memory controller 200 of FIG. 1 may map data that is to be programmed with the memory cells, based on a first table TB1'. According to an embodiment, in the first table TB1', a first page, a second page, and a third page of the erase state E may have the same bit mapping as a first page, a second page, and a third page of the uppermost program state P15. For example, when the target program states are the erase state E and the uppermost program state P15, bit mapping in which the first page, the second page, and the third page of the erase state E have the same bit mapping as the first page, the second page, and the third page of the uppermost program state P15 and in which only the fourth page of the erase state E has different bit mapping from the fourth page of the uppermost program state P15 may be used in the memory controller 200 of FIG. 1. Thus, when target program states are set for some memory cells in an erase state before a program operation are set, the memory controller 200 of FIG. 1 may increase a data mapping effect such that the target program states do not become the erase state E and the uppermost program state P15, and perform encoding.

FIG. 9 illustrates a table for explaining LLR mapping according to an embodiment of the inventive concept. A second table TB2 of FIG. 9 may be, for example, a case where the indicator data described above with reference to FIG. 7B has been set.

Referring to FIG. 9, an LLR value may be mapped with respect to each group of memory cells in an erase state before a program operation, based on the indicator data. In detail, as for the memory cells in the first group GRP_1, based on '2' as an indicator data value corresponding to the memory cells, 4.0 may be mapped as an LLR of a first page, 4.0 may be mapped as an LLR of a second page, and −4.0 may be mapped as an LLR of a third page. As for the memory cells in the second group GRP_2, based on '1' as an indicator data value corresponding to the memory cells, 2.0 may be mapped as an LLR of a first page, 2.0 may be mapped as an LLR of a second page, and −2.0 may be mapped as an LLR of a third page. As for the memory cells not belonging to any group, 0.0 may be mapped as LLRs of a first page, a second page, and a third page, based on '0' as an indicator data value corresponding to the memory cells.

According to an embodiment, as the absolute value of an LLR increases, the probability that a bit of a corresponding memory cell changes from 0 to 1 or from 1 to 0 may increase. For example, when a data bit in a first page is 1 and may be changed from 1 to 0, the probability that the bit data of the first page becomes 0 may increase when the LLR of a corresponding cell of the first page is 2.0, compared with when the LLR of the corresponding cell of the first page is 0.0. When the data bit in the first page is 1 and may be changed from 1 to 0, the probability that the first page becomes 0 may increase when the LLR of a corresponding cell of the first page is 4.0, compared with when the LLR of the corresponding cell of the first page is 2.0.

For example, when the data bit in the first page is 0 and may be changed from 0 to 1, the probability that the data bit of the first page becomes 1 may increase when the LLR of the corresponding cell of the first page is −2.0, compared with when the LLR of the corresponding cell of the first page is 0.0. When the data bit in the first page is 0 and may be changed from 0 to 1, the probability that the bit data of the first page becomes 1 may increase when the LLR of the corresponding cell of the first page is −4.0, compared with when the LLR of the corresponding cell of the first page is −2.0. Although an LLR and a bit value have been described above by focusing on a first page cell, this description is equally applicable to second and third page cells. According to an embodiment, when an LLR value is 0, this means that any bit does not make a difference. When a data bit is changed from 0 to 1, an LLR has a negative value. When a data bit is changed from 1 to 0, an LLR has a positive value.

Figure 10:
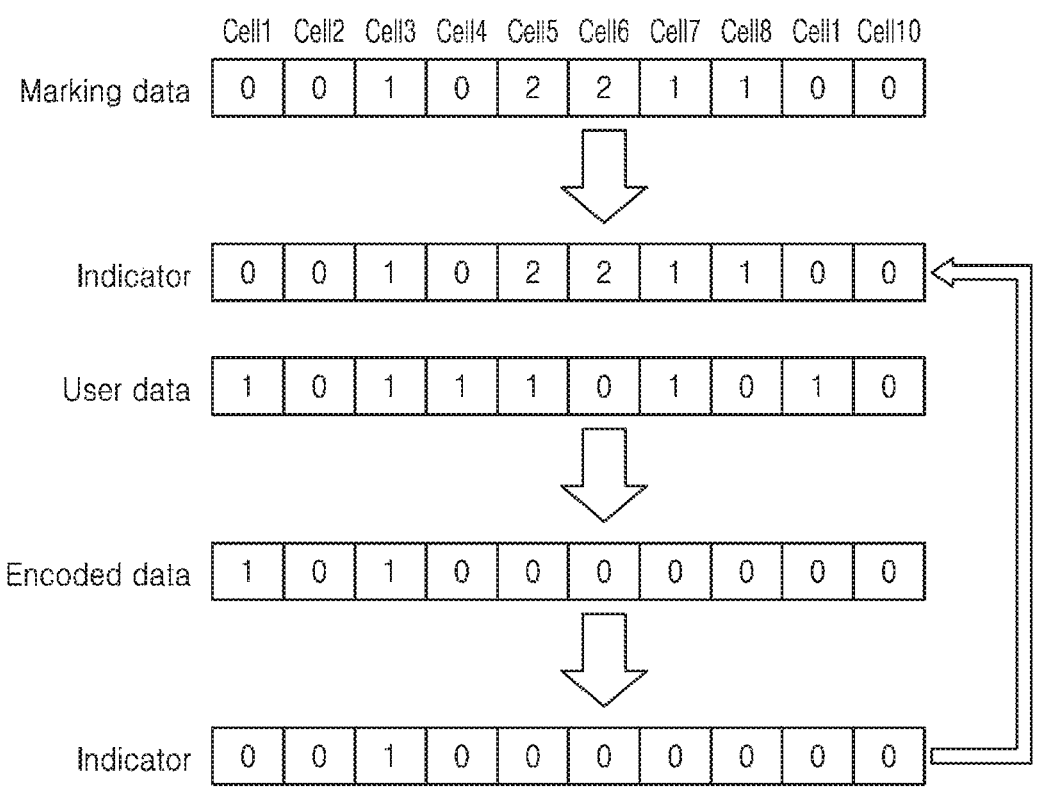
FIG. 10 illustrates a block diagram for explaining updating of indicator data according to an embodiment of the inventive concept.

FIG. 10 illustrates a block diagram for explaining updating of indicator data according to an embodiment of the inventive concept. FIG. 10 illustrates an encoding operation on, for example, an first page. According to an embodiment, updated indicator data may serve as a basis for an encoding operation on a next bit page.

Referring to FIG. 10, third, fifth, sixth, seventh, and eighth memory cells from among first through tenth memory cells may be marked. In detail, the fifth and sixth memory cells may be memory cells included in the first group GRP_1 of FIG. 7B, and the third, seventh, and eighth memory cells may be memory cells included in the second group GRP_2 of FIG. 7B. For example, marking on a memory cell may be an indicator that indicates that programming to a target-program state is prevented during encoding.

Based on the marking on the memory cells, indicator data values may be set. For example, indicator data values of the third, seventh, and eighth memory cells may be '1', and indicator data values of the fifth and sixth memory cells may be '2'.

Based on the indicator data, the first pages of the first through tenth memory cells may be encoded. In detail, in the case of the fifth memory cell, a user data bit is 1, but may be encoded to 0, based on indicator data. In the case of the sixth memory cell, an indicator data value is 2 and a user data bit is 0, but encoded data may be 0.

In the case of the third, seventh, and eighth memory cells included in the second group GRP_2 of FIG. 7B, user data bits may be encoded to 0 at a low probability, compared with the case of the memory cells included in the first group GRP_1 of FIG. 7B. For example, in the case of the third memory cell, a user data bit is 1, but encoded data may still be 1.

After user data is encoded, indicator data may be updated to be used when a next page is encoded. According to an embodiment, as for the memory cells determined to undergo a program operation to program states other than a target program state via encoding, indicator data may be updated.

In detail, in the case of the fifth and seventh memory cells, although respective pieces of indicator data are '2' and '1', because data (bit) mapping to program states other than the target program state via encoding was determined, the respective pieces of indicator data may be updated to '0'. In the case of the sixth and eighth memory cells, although respective pieces of indicator data thereof are '2' and '1', because user data bits thereof are '0', data (bit) mapping to program states other than the target program state is determined, and accordingly the respective pieces of indicator data may be updated to '0'. In the case of the third memory cell, although indicator data is '1' and a user data bit is '1', a data bit after encoding is still 1, and thus the indicator data may not be updated but may maintain 1. The indicator data may be characterized as updated based on each data bit generated in each of the memory cells and the data (bit) mapping.

The updated indicator data may serve as a basis for data encoding on a next page within a word line. For example, when the indicator data is updated during the first page data encoding as in FIG. 10, second page data may be encoded using the indicator data updated during the first page data encoding, and the indicator data may be updated again. The third page encoding may be performed based on indicator data updated during the second page encoding.

Figure 11:
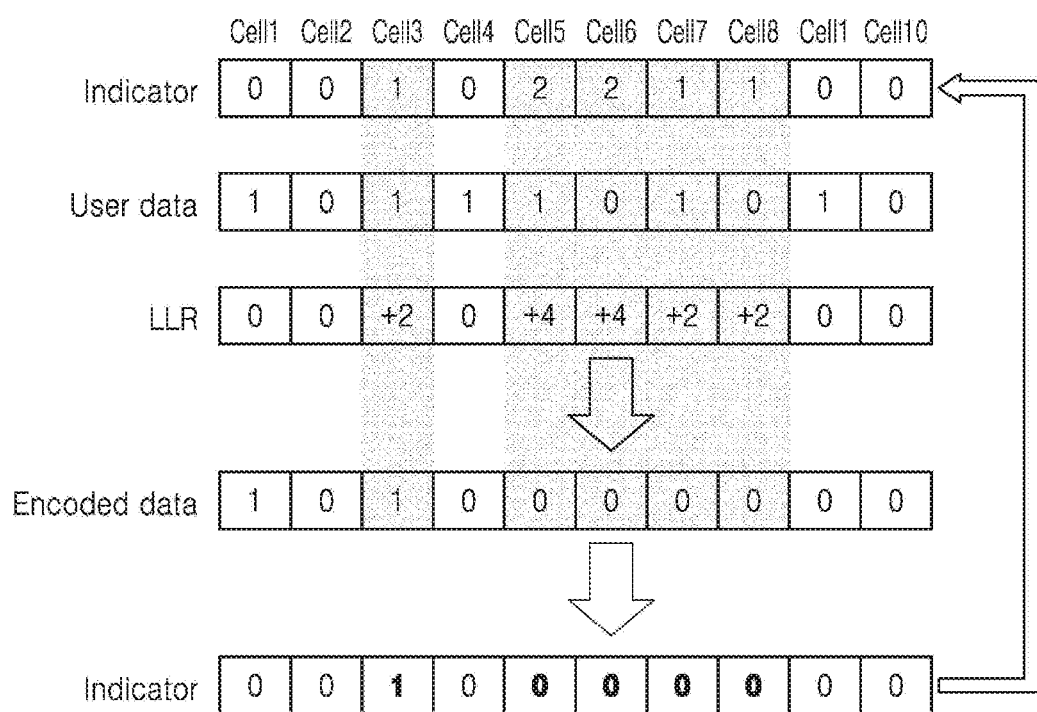
FIG. 11 illustrates a block diagram for explaining updating of indicator data according to an embodiment of the inventive concept in greater detail.

FIG. 11 illustrates a block diagram for explaining updating of indicator data according to an embodiment of the inventive concept in greater detail. FIG. 11 illustrates an encoding operation on, for example, an LSB page. According to an embodiment, updated indicator data may serve as a basis for an encoding operation on a next bit page.

Referring to FIG. 11, indicator data values of the third, seventh, and eighth memory cells from among the first through tenth memory cells may be '1', and indicator data values of the fifth and sixth memory cells may be '2'. In other words, the fifth and sixth memory cells may be included in the first group GRP_1 of FIG. 7B, and the third, seventh, and eighth memory cells may be included in the second group GRP_2 of FIG. 7B.

Based on the indicator data, the LLR values for the first through tenth memory cells may be mapped. In detail, the LLR values of the third, seventh, and eighth memory cells may be mapped as '2'. The LLR values of the fifth and sixth memory cells may be mapped as '4'.

Accordingly, when an LLR value is '4', a user data bit may be encoded to 0. In other words, in the case of the fifth memory cell, although a user data bit is 1, an LLR value is '4', and thus encoded data based on the LLR value may be 0. In the case of the sixth memory cell, because a user data bit is 0, although an LLR value is '4', encoded data based on the LLR value may be 0.

When an LLR value is '2', a user data bit may be encoded to 0 at a lower probability than when the LLR value is '4'. In other words, in the third memory cell from among the third, seventh, and eighth memory cells having LLR values of '2', a user data bit may be 1 but encoded data may be still 1, whereas, in the seventh memory cell, a user data bit may be 1 but encoded data may be 0.

After encoding based on an LLR is completed, indicator data may be updated. According to an embodiment, as for the memory cells determined to undergo a program operation to program states other than a target program state via encoding, indicator data may be updated.

In detail, in the case of the fifth and seventh memory cells, although respective pieces of indicator data are '2' and '1', data mapping to program states other than a target program state via encoding based on an LLR has been determined, and thus the respective pieces of indicator data may be updated to '0'. In the case of the sixth and eighth memory cells, although respective pieces of indicator data are '2' and '1', user data bits are '0', and thus data mapping to program states other than the target program state is determined. Thus, the respective pieces of indicator data may be updated to '0'. In the case of the third memory cell, because indicator data is '1' and an LLR value is '2' but encoded data is still '1', the indicator data may not be updated but may maintain 1.

Figure 12:
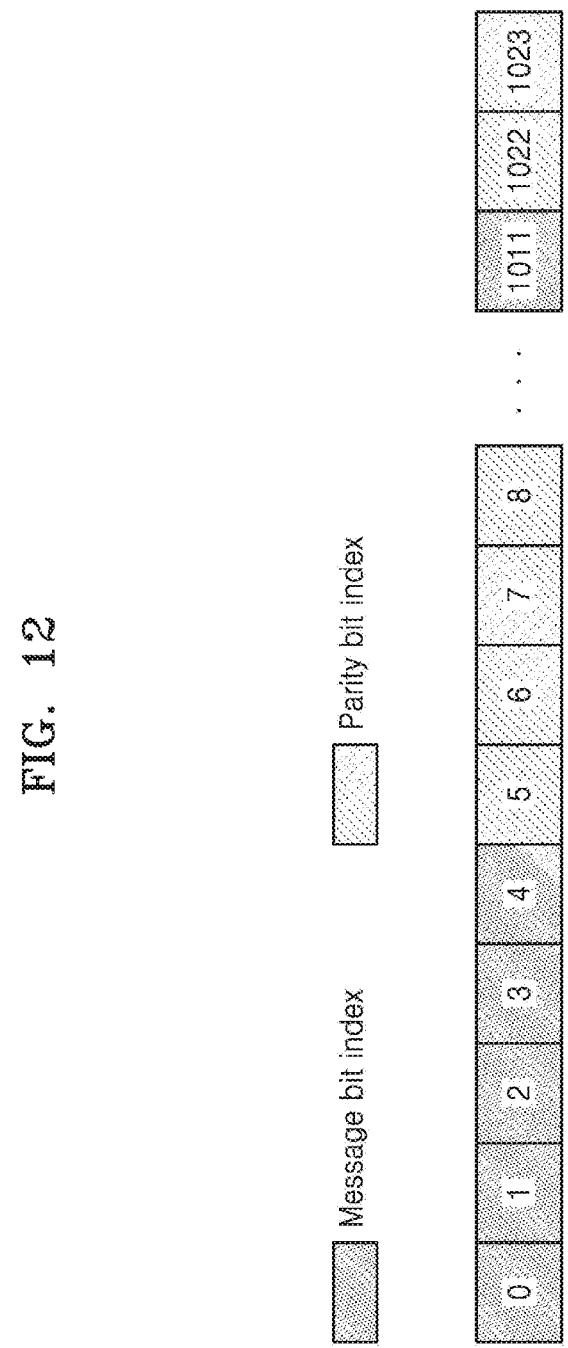
FIG. 12 illustrates a block diagram of an example of encoded page data of memory according to an embodiment of the inventive concept.

FIG. 12 illustrates a block diagram of an example of encoded page data of memory according to an embodiment of the inventive concept.

Referring to FIG. 12, the encoded page data may include message bits and parity bits. The message bits may include, for example, data information input from the host HOST of FIG. 1. The parity bits may be, for example, extra bits added for encoding in addition to the message bits. Although not shown, the page data may further include extra bits for an error correction code (ECC).

According to an embodiment, the parity bits may be encoded based on an LLR and user data of each memory cell. The parity bits may be encoded via, for example, a successive cancellation or list successive cancellation algorithm of a polar code. According to an embodiment, the parity bits of page data may be encoded by the erase state control encoder 212 of FIG. 3, and then a product of the page data and a deflection matrix may be provided to the ECC unit 213 of FIG. 3.

According to an embodiment, when the page data is decoded, the page data may be multiplied by the deflection matrix, and then only the message bits may be selected to thereby restore the user data. The page data may be decoded by the erase state control decoder 214 of FIG. 3. According to an embodiment, after an error generated on the page data in the memory device 100 of FIG. 1 is corrected by the ECC unit 213 of FIG. 3, error-corrected page data may be provided to the erase state control decoder 214 of FIG. 3.

Figure 13:
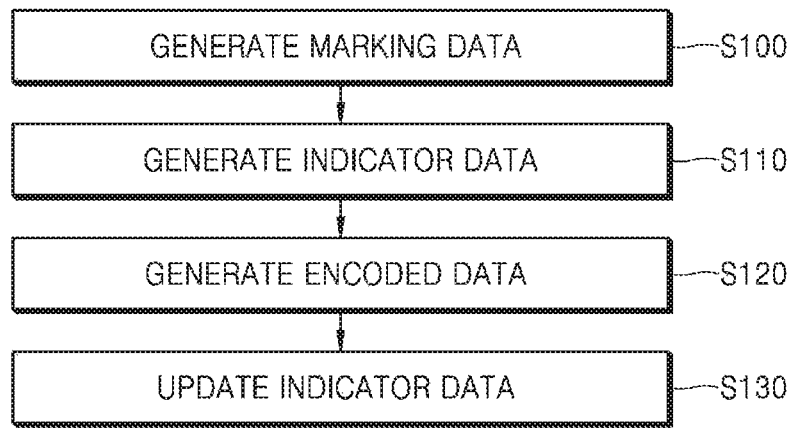
FIG. 13 illustrates a flowchart of a method of operating a memory controller, according to an embodiment of the inventive concept.

FIG. 13 illustrates a flowchart of a method of operating a memory controller, according to an embodiment of the inventive concept. For example, the method of operating a memory controller 200 of FIG. 1 according to the present embodiment may be performed in a time sequential manner in the memory controller 200 of FIG. 1.

Referring to FIG. 13, marking data for memory cells before a program operation is generated, in operation S100. The marking data may be generated based on, for example, a result of at least one read operation performed on the memory cells, based on at least one of first and second critical voltages.

After the marking data is generated, indicator data corresponding to each memory cell is generated, in operation S110. The memory cells for which the indicator data is generated may be in an erase state before a program operation. According to an embodiment, the indicator data may serve as a basis for setting at least one target program state.

After the indicator data is generated, encoded data for each memory cell is generated, in operation S120. According to an embodiment, to generate encoded data for each memory cell, encoding may be performed on the bit pages of each data of each memory cell, based on the marking data and the indicator data.

After the encoded data is generated, the indicator data is updated, in operation S130. The updated indicator data is used to encode a next page within the same word line, and after the encoding, the indicator data is updated again. According to an embodiment, as for the memory cells determined to undergo a program operation to program states other than a target program state via generation of the encoded data, indicator data may be updated. As for memory cells likely to be programmed in the target program state even after the encoded data is generated, indicator data may be maintained.

Figure 14:
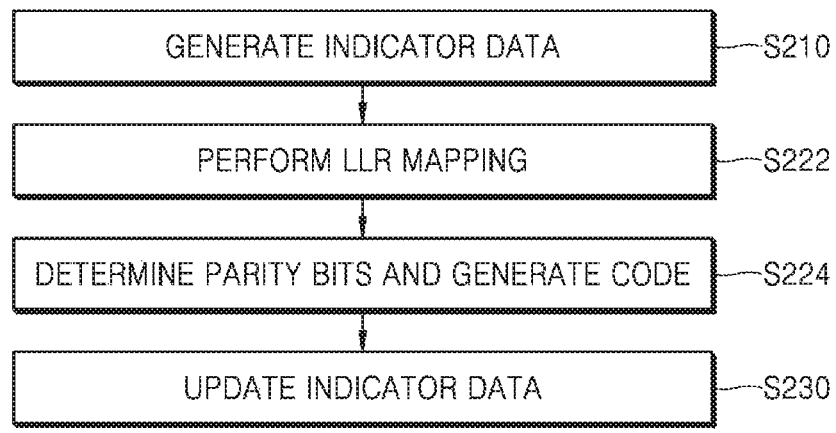
FIG. 14 illustrates a flowchart of a method of operating a memory controller, according to an embodiment of the inventive concept.

FIG. 14 illustrates a flowchart of a method of operating a memory controller, according to an embodiment of the inventive concept. For example, the method of operating a memory controller according to the present embodiment may be performed in a time sequential manner in the memory controller 200 of FIG. 1.

Referring to FIG. 14, indicator data corresponding to memory cells before a program operation is generated, in operation S210. The memory cells for which the indicator data is generated may be in an erase state before a program operation. According to an embodiment, the indicator data may serve as a basis for setting at least one target program state. In detail, the indicator data may be a basis for LLR mapping with respect to the memory cells.

After the indicator data is generated, an LLR for each memory cell is mapped, in operation S222. According to an embodiment, the LLR may be a basis for determining parity bits for the memory cells. For example, as the absolute value of an LLR increases, the probability that a bit of a corresponding memory cell becomes 0 or 1 may increase.

After the LLR is mapped, parity bits are determined, and a code is generated, in operation S224. The parity bits may be, for example, extra bits added for encoding in addition to message bits. According to an embodiment, the parity bits may be encoded based on an LLR and user data of each memory cell. According to an embodiment, after the parity bits are determined, page data including the parity bits is multiplied by a deflection matrix to thereby generate the code. The generated code may be provided to the ECC unit 213 of FIG. 3.

After the parity bits are determined and the code is generated, the indicator data is updated, in operation S230. According to an embodiment, as for the memory cells determined to undergo a program operation to program states other than a target program state via determination of the parity bits, indicator data may be updated. As for memory cells likely to be programmed in the target program state even after the parity bits are determined, indicator data may be maintained.

Figure 15:
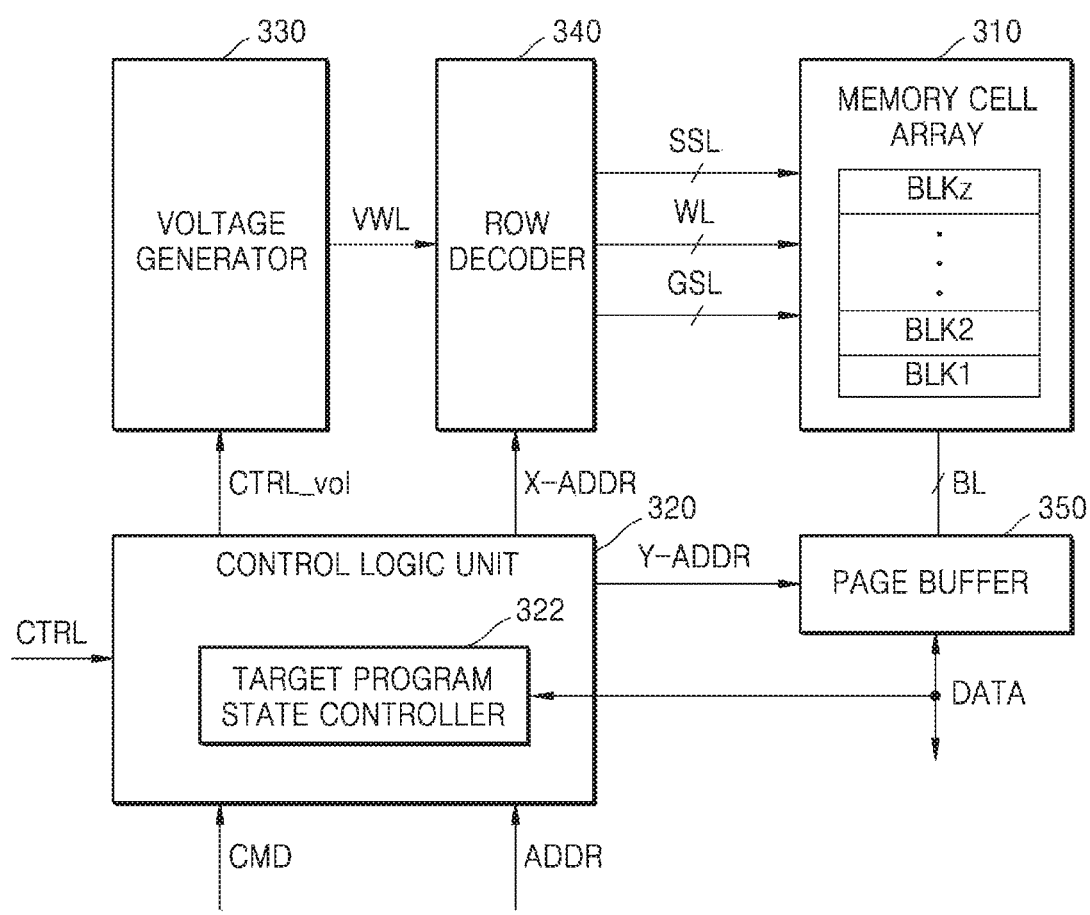
FIG. 15 illustrates a block diagram of a memory device according to an embodiment of the inventive concept.

FIG. 15 illustrates a block diagram of a memory device 300 according to an embodiment of the inventive concept. The memory device 300 of FIG. 15 is similar to the memory device 100 of FIG. 2. Accordingly, for the sake of brevity, the following description will focus on differences between the memory device 300 shown in FIG. 15 with respect to the memory device 100 shown in FIG. 2, and description of similar structure and functionality will be omitted. The memory device 300 in FIG. 15 includes the memory cell array 310, the control logic unit 320, the voltage generator 330, the row decoder 340 and the page buffer 350 that are respectively structured and function in a similar manner as the memory cell array 110, the control logic unit 120, the voltage generator 130, the row decoder 140 and the page buffer 150. However, the memory device 300 of FIG. 15 includes a target program state controller 322 in a control logic unit 320.

The target program state controller 322 may receive and/or generate erase state information about a plurality of memory cells, by sensing data DATA output by a memory cell array 310. The target program state controller 322 may perform a program operation on the memory cell array 310, based on a command CMD, an address ADDR, and a control signal CTRL received from the outside (for example, a memory controller) of the memory device 300 and the erase state information.

According to an embodiment, the target program state controller 322 may set a target program state for some of the memory cells included in the memory cell array 110, based on the erase state information. The target program state controller 322 may output various types of signals such that the memory cells for which the target program state has been set are programmed in one of program states other than the target program state. In embodiments of the inventive concept, the target program state controller 322 of FIG. 15 may be structured and functioned similarly as the target program state controller 210 as described with respect to FIGS. 1 and 3. In such a case, although not particularly shown in FIG. 15, the target program state controller 322 may receive the input data DATA_I from a memory controller and provide the restored output data DATA_O to the memory controller.

Figure 16:
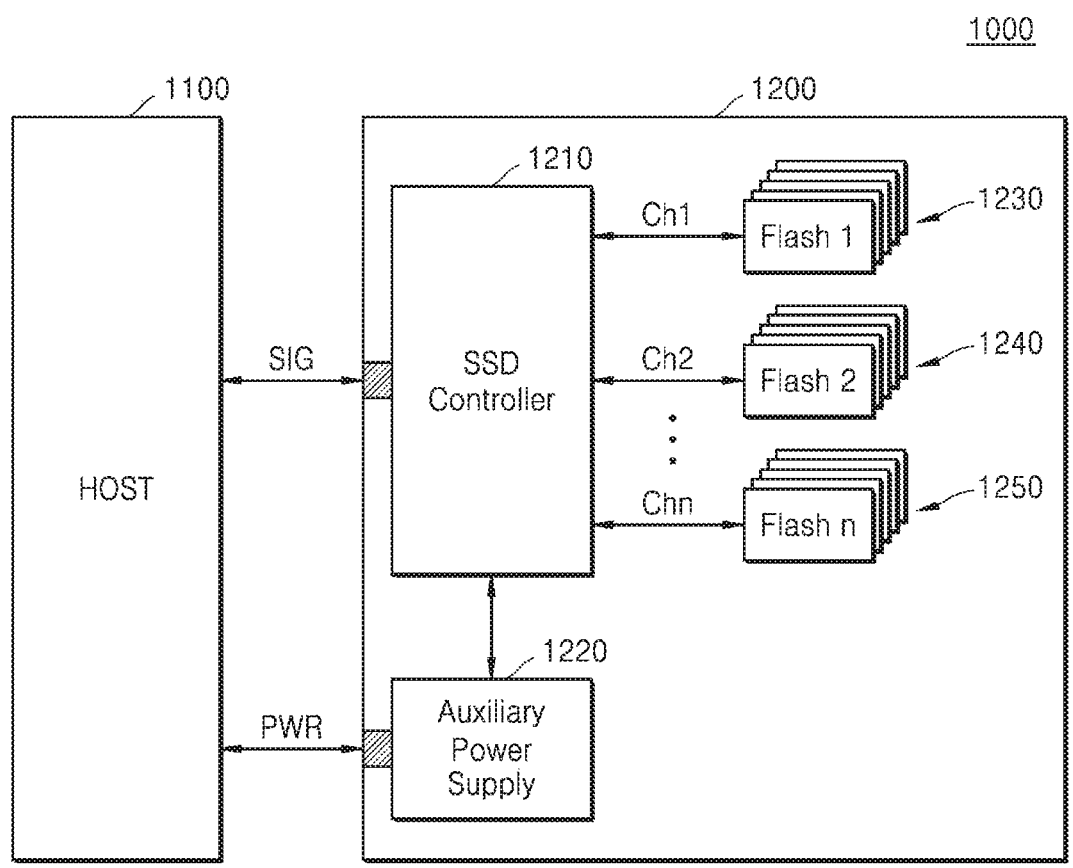
FIG. 16 illustrates a block diagram of a solid state drive (SSD) system including a memory controller, according to embodiments of the inventive concept.

FIG. 16 illustrates a block diagram of an SSD system 1000 including a memory controller (i.e., SSD controller), according to embodiments of the inventive concept.

Referring to FIG. 16, the SSD system 1000 includes a host 1100 and an SSD 1200. The SSD 1200 may transmit or receive signals SIG to or from the host 1100 through a signal connector and may receive power PWR from the host 1100 through a power connector.

The SSD 1200 includes an SSD controller 1210, an auxiliary power supply 1220, and a plurality of memory devices 1230, 1240, and 1250. The plurality of memory devices 1230, 1240, and 1250 may be, for example, flash memory devices. The SSD 1200 may use non-volatile memory devices such as for example phase change RAMs (PRAMs), magnetic RAMs (MRAMs), resistive random access memories (ReRAMs), or ferroelectric RAMs (FRAMs), instead of flash memory. The plurality of memory devices 1230, 1240, and 1250 may be connected to the SSD controller 1210 via a plurality of channels Ch1 through Chn. One or more memory devices may be connected to one channel Flash memory connected to one channel may be connected to the same data bus.

The SSD controller 1210 may transmit or receive a signal SIG to or from the host 1100 via the signal connector. The signal SIG may include a command, an address, data, and the like. The SSD controller 1210 may write or read data to or from a memory device, according to a command of the host 1100. The SSD controller 1210 may be realized using the embodiments described above with reference to FIGS. 1-15.

While the inventive concept has been particularly shown and described with reference to exemplary embodiments thereof, it will be understood by those of ordinary skill in the art that various changes in form and details may be made therein without departing from the spirit and scope as defined by the following claims.

What is claimed is:

1. A method of operating a memory controller, the method comprising:
    classifying a plurality of memory cells in an erase state into a plurality of groups, based on erase state information about the plurality of memory cells in the erase state;
    setting target states for at least some memory cells from among memory cells included in at least one of the plurality of groups to at least one predetermined state from among a plurality of program states;
    performing error correction code (ECC) encoding based on the set target states;
    programming the at least some memory cells in the erase state included in at least one of the plurality of groups to program states based on the ECC encoded data, the program states being from among the plurality of program states other than the set target states, and
    wherein the plurality of memory cells correspond to a three dimensional vertical NAND flash memory.

2. The method of claim 1, wherein the classifying of the plurality of memory cells comprises classifying memory cells having a threshold voltage greater than a first voltage from among the plurality of memory cells into a first group.

3. The method of claim 2, wherein the classifying of the plurality of memory cells comprises:
    performing at least one read operation on the plurality of memory cells, based on the first voltage; and
    marking the at least some memory cells, based on a result of the performing the at least one read operation,
    wherein the setting the target states comprises setting the erase state and the uppermost program state for the marked at least some memory cells.

4. The method of claim 1, wherein the setting of the target states for at least some memory cells further comprises performing bit mapping on the target states, and
    when target states are set, the performing of the bit mapping comprises performing the bit mapping such that at least a first page of the bit mapping of the target states is shared between the target states.

5. The method of claim 4, wherein the classifying the plurality of memory cells comprises setting indicator data, based on marking data corresponding to each of the plurality of groups, and
    wherein the indicator data is updated based on each data bit generated in each of the plurality of memory cells and the bit mapping.

6. The method of claim 5, wherein the setting of the target states for at least some memory cells further comprises mapping a log likelihood ratio (LLR) for the plurality of memory cells, based on the indicator data.

7. The method of claim 6, wherein the setting of the target states for at least some memory cells further comprises generating parity bits for the plurality of memory cells, based on the LLR, and encoding data corresponding to the plurality of memory cells, based on the generated parity bits.

8. A memory controller for controlling a memory operation on a memory cell array including a plurality of memory cells, the memory controller comprising:
    an erase information collector configured to receive erase state information about the plurality of memory cells from the memory cell array, classify the plurality of memory cells into a first group, a second group, and a third group based on the erase state information, and output first information corresponding to the first group, second information corresponding to the second group, and third information corresponding to the third group; and
    an erase state control encoder configured to receive the first information, the second information, and the third information from the erase information collector, set target states including at least one predetermined state from among a plurality of program states, encode data to be programmed to memory cells included in the first group based on the first information and the target states, encode data to be programmed to memory cells included in the second group based on the second information, and encode data to be programmed to memory cells included in the third group based on the third information,
    wherein the erase state control encoder is configured to perform bit mapping corresponding to the plurality of program states, based on the target states.

9. The memory controller of claim 8, wherein the erase state control encoder is configured to perform the bit mapping such that at least a first page of the bit mapping of the at least one predetermined state is shared.

10. The memory controller of claim 9, wherein the erase information collector is configured to classify memory cells having a threshold voltage greater than a first voltage from among the plurality of memory cells into the first group, classify memory cells having a threshold voltage less than the first voltage and greater than a second voltage from among the plurality of memory cells into the second group, and classify memory cells having a threshold voltage less than the second voltage from among the plurality of memory cells into the third group.

11. The memory controller of claim 10, wherein the erase state control encoder is configured to set target states for at least some of the memory cells included in the first group and the second group.

12. The memory controller of claim 11, wherein the erase state control encoder is configured to encode some of the memory cells included in the first group and the second group to prevent programming to at least one of the target states.

13. The memory controller of claim 9, wherein a first page and a second page of each of the target states corresponds to same bit mapping.

14. The memory controller of claim 9, wherein the erase state control encoder is further configured to program at least some memory cells in the erase state included in the first groups to first program states from among the plurality of program states other than the set target states and program at least some memory cells in the erase state included in the second group to second program states from among the plurality of program states other than the set target states.

15. The memory controller of claim 14, wherein the first program states differ from the second program states.

16. A memory system comprising:
a memory device comprising a memory cell array corresponding to a three dimensional vertical NAND flash memory;
a memory controller configured to control a memory operation on the memory cell array; and
a target state controller configured to classify a plurality of memory cells in an erase state into a plurality of groups, based on erase state information about the plurality of memory cells in the erase state, set target states for at least some memory cells from among memory cells included in at least one of the plurality of groups to at least one predetermined state from among a plurality of program states, perform error correction code (ECC) encoding based on the set target states, and program the at least some memory cells in the erase state included in at least one of the plurality of groups to program states based on the ECC encoded data, the program states being from among the plurality of program states other than the set target states.

17. The memory system of claim 16, wherein the target state controller is disposed in the memory controller.

18. The memory system of claim 17, wherein the target state controller is configured to program the at least some memory cells by performing bit mapping on the erase state and the uppermost program state, and
when target states are set, at least a first page of the bit mapping of the plurality of target program states is shared between the plurality of target program states.

19. The memory system of claim 18, wherein a first page and a second page of each of the target states corresponds to same bit mapping.

* * * * *